(12) United States Patent
Kawano et al.

(10) Patent No.: US 6,201,490 B1
(45) Date of Patent: Mar. 13, 2001

(54) DA CONVERSION APPARATUS TO REDUCE TRANSIENT NOISE UPON SWITCHING OF ANALOG SIGNALS

(75) Inventors: Toshihiko Kawano, Tokushima-ken; Ryuuji Wakatsuki; Kiyoto Kuroiwa, both of Hamamatsu, all of (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 09/191,425

(22) Filed: Nov. 12, 1998

(30) Foreign Application Priority Data

Nov. 14, 1997 (JP) .................................... 9-313061
Feb. 17, 1998 (JP) .................................. 10-034651
Oct. 29, 1998 (JP) .................................. 10-308210

(51) Int. Cl.$^7$ ............................. H03M 1/62; H03M 1/84
(52) U.S. Cl. ........................................ 341/139; 341/144
(58) Field of Search ................................ 341/144, 145, 341/139, 141

(56) References Cited

U.S. PATENT DOCUMENTS

| | | | |
|---|---|---|---|
| 4,686,507 | * 8/1987 | Kessler | 340/347 |
| 4,868,571 | * 9/1989 | Inamasu | 341/118 |
| 4,873,492 | * 10/1989 | Myer | 330/86 |
| 4,998,108 | * 3/1991 | Ginthner et al. | 341/145 |
| 5,541,600 | * 7/1996 | Blumenkrantz et al. | 341/139 |

FOREIGN PATENT DOCUMENTS 793579   10/1995   (JP) .

* cited by examiner

Primary Examiner—Peguy JeanPierre
(74) Attorney, Agent, or Firm—Pillsbury Winthrop LLP (57) ABSTRACT

A D/A conversion apparatus includes a DSP which receives and converts input digital data with different conversion factors, to generate a plurality of digital data having different levels, selects one of the plurality of the generated digital data, depending upon the signal quality of the input digital data, while attenuating the other digital data to be lower than a predetermined noise level. A plurality of D/A converting devices convert the respective generated digital data into corresponding analog signals. A re-converting device converts the level of each of the analog signals into an original level, based on a corresponding one of the conversion factors with which the input digital data is converted by the DSP. An adding device adds the re-converted analog signals. An attenuating device attenuates, in an input stage of the adding device, medium-to-high frequency components of at least one of the analog signals generated by at least one of the D/A converting devices that receives the attenuated digital data, and corresponding to digital data obtained by converting the input digital data with a smaller conversion factor than that of the digital data selected and generated by the DSP.

18 Claims, 5 Drawing Sheets

DA CONVERSION APPARATUS TO REDUCE TRANSIENT NOISE UPON SWITCHING OF ANALOG SIGNALS

BACKGROUND OF THE INVENTION

1. Field of the Invention

The present invention relates to a floating type D/A conversion apparatus that performs level conversion on input digital data with different conversion factors, converts the digital data into respective analog signals, and then adds the analog signals after re-converting them into the original level, to thereby provide a wide dynamic range.

2. Prior Art

With an improvement in the conversion accuracy of A/D converters due to development of $\Delta\Sigma$ modulators of higher order in recent years, D/A converters have been desired to provide even higher resolution and wider dynamic range. To this end, floating type D/A conversion apparatuses have been developed which use D/A converters (hereinafter referred to as "DAC") capable of converting a limited number of bits, for obtaining higher resolution and wider dynamic range beyond the limited number of conversion bits. In this type of apparatus, when DAC (D/A converter) of N bits (for example, 20 bits) is used for converting digital data of M bits (for example, 24 bits, M>N) where the significant bits of the data are P bits (M$\geq$P>N), the DAC converts the digital data as it is into a corresponding analog signal, while truncating or discarding less significant M–N bits (for example, 4 bits). When the output level of the digital data is lowered, and the significant word length becomes equal to P' bits (P$\leq$N), the conversion apparatus multiplies the digital data by $2^{M-N}$, namely, shifts the original data toward the MSB (most significant bit) by M–N bits, while filling the less significant M–N bits with zero, and then converts the obtained digital data into an analog signal. Whether the input digital data should be converted without being changed, or multiplied by $2^{M-N}$ before D/A conversion, is determined depending upon whether overflow occurs (the digital input level exceeds a threshold value) after shifting the input digital data by M–N bits.

With the above-described conversion, when the significant bits of the data is equal to P bits, almost no adverse influence arises from the truncation of the less significant bits since the converted word length is sufficiently large. Even if any problem arises, dithering, or other operation, may be performed as needed to eliminate the problem. Where the significant bit length is equal to P', on the other hand, the data is multiplied by $2^{M-N}$, and the less significant M–N bits are truncated or discarded during the D/A conversion, so that the DAC can effectively convert digital data of the less significant M–N bits that would be otherwise truncated if the data is not multiplied by $2^{M-N}$, into a corresponding analog signal, thus assuring higher resolution and wider dynamic range. In the latter case, however, the analog signal generated by the DAC, which has also been multiplied by $2^{M-N}$, need be multiplied by $\frac{1}{2}^{M-N}$, so that the level of the analog output matches that of the original digital data.

In one known example of floating type D/A conversion apparatus using a single DAC, the gain of an analog amplifier that amplifies the output of the DAC is changed according to a level conversion factor with which input digital data was converted. In another example as disclosed in Japanese Patent Publication (Kokoku) No. 7-93579, a plurality of DACs are used for converting a plurality of digital data that have been converted to different levels with different conversion factors, into respective analog signals, and a selected one of the outputs of the DAC is generated, for which the level conversion was performed with the most appropriate conversion factor.

In the former type of the known floating type D/A conversion apparatus, however, the gain of the analog amplifier must be instantly changed upon a change in the level of the digital data, and, if the output of the amplifier does not immediately follow the change in the level of the digital data, or the DC offset of the amplifier varies, uncomfortable noise may arise which cannot be aurally ignored. In the latter type of apparatus that selects one of the analog signals generated by the DAC, there is also a problem of transient noise upon switching of the analog signals. These problems may become extremely serious where the resolution of digital data to be processed reaches a low-noise region in which the SN ratio ranges from 120 to 140 decibels, which could be resolved only by a known analog circuit arrangement.

SUMMARY OF THE INVENTION

It is the object of the present invention to provide a floating-type D/A conversion apparatus that has a further reduced influence of noise, and provides an expanded dynamic range.

To attain the above object, the present invention provides a D/A conversion apparatus, comprising an input terminal that receives input digital data, a level converting device that converts the input digital data with different conversion factors, to generate a plurality of digital data having different levels, an output device that selects one of the plurality of digital data generated by the level converting device, depending upon a signal quality of the input digital data, to generate the selected digital data, while attenuating the other digital data to be lower than a predetermined noise level, to generate the attenuated digital data, a plurality of D/A converting devices that convert respective digital data generated by the output device, into corresponding analog signals, and generate the analog signals, a re-converting device that converts a level of each of the analog signals generated by the D/A converting devices, into an original level, based on a corresponding one of the conversion factors with which the input digital data is converted by the level converting device to generate the re-converted analog signals, an adding device that adds the re-converted analog signals generated by the re-converting device; and an attenuating device that attenuates, in an input stage of the adding device, medium-to-high frequency components of at least one of the analog signals generated by at least one of the D/A converting devices that receives the attenuated digital data, the at least one of the analog signals corresponding to digital data obtained by converting the input digital data with a smaller conversion factor than that of the digital data selected and generated by the output device.

With the above construction according to the present invention, the plurality of D/A converting devices convert digital data resulting from level conversion with different conversion factors, into respective analog signals. A selected one of the outputs of the D/A converting devices is generated without being changed, while the output(s) of the other D/A converting device(s) is/are digitally attenuated to be lower than the noise level of the converting device, and then the adding device adds the outputs of these D/A converting devices after being converted to the original level of the input digital data. In this type of D/A conversion apparatus wherein the inputs of the two or more DACs are switched from one to another, noise that occurs upon switching is advantageously reduced, as compared with the case where the outputs (analog signals) of the DAC are switched from one to another. In this method, however, the adding device receives residual noises from the D/A conversion device or devices whose input level has been attenuated, and the residual noise limits the dynamic range, namely, impedes expansion of the dynamic range. If the conversion factor of the digital data is G, for example, the resulting analog signal is received by the adding device after being multiplied by 1/G, and thus the residual noise received by the adding device increases with a reduction in the conversion factor. While the residual noise may be ignored if the input digital data has a relatively high level, the noise reaches a level that cannot be ignored if the input digital data has a relatively low level, and thus the dynamic range cannot be improved.

In order to prevent the residual noise of systems other than the system selected by the output device, from being larger than the digital data selected by the output device to eventually provide a meaningful output of analog signal, the apparatus of the invention is adapted to attenuate again each analog signal into which residual noise was converted through D/A conversion. As a result, the residual noise of the final output of analog signal can be effectively reduced, namely, the noise floor can be lowered when the adding device adds the analog signals into which all of the digital data are converted, thus assuring an improved dynamic range of the conversion apparatus. The digital data corresponding to the analog signals to be attenuated in this manner include at least those whose residual noise is likely to be larger than the selected digital data, namely, those digital data that have been level-converted with a smaller conversion factor than that of the selected digital data. It suffices in practical use if the analog signal(s) corresponding to such digital data are attenuated to be lower than the noise level of the selected digital data.

According to the present invention, the attenuating device attenuates only medium-to-high frequency components of the analog signal from the relevant D/A converting device, and therefore, the dc input impedance of the adding device does not vary due to ON/OFF operations of the attenuating device. Accordingly, fluctuation in the output offset due to changes in the dc gain of the adding device can be reduced, and pop noise can be effectively avoided which would otherwise occur upon switching of the D/A converting devices.

The present invention also provides a D/A conversion apparatus, comprising an input terminal that receives input digital data, a level converting device that converts the input digital data with different conversion factors, to generate a plurality of digital data having different levels, an output device that selects one of the plurality of digital data generated by the level converting device, depending upon a signal quality of the input digital data, to generate the selected digital data, while attenuating the other digital data to be lower than a predetermined noise level, to generate the attenuated digital data, a switching device that switches, upon selection of the digital data, between first digital data that has been selected and generated, and second digital data that is to be selected and generated next, while cross-fading the first and second digital data, a plurality of D/A converting devices that convert respective digital data generated by the output device, into corresponding analog signals, and generate the analog signals, a re-converting device that converts a level of each of the analog signals generated by the D/A converting devices, into an original level, based on a corresponding one of the conversion factors with which the level conversion device converts the input digital data to generate the re-converted analog signals, and an adding device that adds the re-converted analog signals generated by the re-converting device.

With the above construction accordingly to the present invention, 1) the adding device adds analog signals resulting from D/A conversion of a plurality of digital data, 2) a selected one of the outputs of the D/A converting devices is generated as an effective output, by attenuating digital data other than that corresponding to the selected output, and 3) cross-fading between the selected and non-selected outputs is performed upon switching therebetween. As a result, the present apparatus causes considerably reduced noise upon switching, and accomplishes D/A conversion with significantly improved accuracy, as compared with the known apparatus.

In this D/A conversion apparatus, too, the attenuating device described above may be provided, so as to ensure a wider dynamic range, while effectively reducing residual noise in the final output of analog signal.

When the amplitude of the input digital data changes from a lower level to a higher level relative to a predetermined level, for example, the attenuating device cancels or stops its attenuating operation for relevant analog signal(s) a predetermined period of time ahead of the start of the cross-fading. When the amplitude of the input digital data changes from a higher level to a lower level relative to the predetermined value, the attenuating device executes or starts its attenuating operation a predetermined period of time after completion of the cross-fading. This arrangement can avoid transient noise that would otherwise occur upon turn-on or turn-off of the analog attenuating operation.

Further, the D/A conversion apparatus of the invention may further include a delay device that delays the input digital data for a predetermined period of time, and a detecting device that detects a change in the amplitude of the input digital data from a lower level to a higher level relative to a predetermined level, ahead of switching to the selected digital data, to allow for a period of time required for cross-fading, so that the switching device finishes cross-fading for switching to the selected digital data when the amplitude of the input digital data exceeds the predetermined level.

With this arrangement, where the amplitude of the input digital data changes from a lower level to a higher level relative to the predetermined level, the timing of the start of cross-fading upon switching of the digital data can be set to precede the point of time at which the amplitude of the input digital data exceeds the predetermined level, so that the switching operation will have been completed by the time when the input digital level exceeds the predetermined level, thereby avoiding clipping of a part of the digital data.

The output device instantly switches to the selected digital data when the amplitude of the input digital data changes from a lower level to a higher level relative to a predetermined level, and switches to the selected digital data when the amplitude of the input digital data changes from a higher level to a lower level relative to the predetermined level, so long as no change from a lower level to a higher level relative to the predetermined level is detected within a predetermined period of time.

With this arrangement, even if the input digital data has a signal waveform containing high frequency components, clipping of the output data due to at least overflow can be surely avoided, and noise occurrence due to frequent switching of digital data can be also prevented.

The above and other objects, features, and advantages of the invention will become more apparent from the following detailed description taken in conjunction with the accompanying drawings.

DETAILED DESCRIPTION

The present invention will be described in detail with reference to the accompanying drawings showing preferred embodiments thereof.

Figure 1:
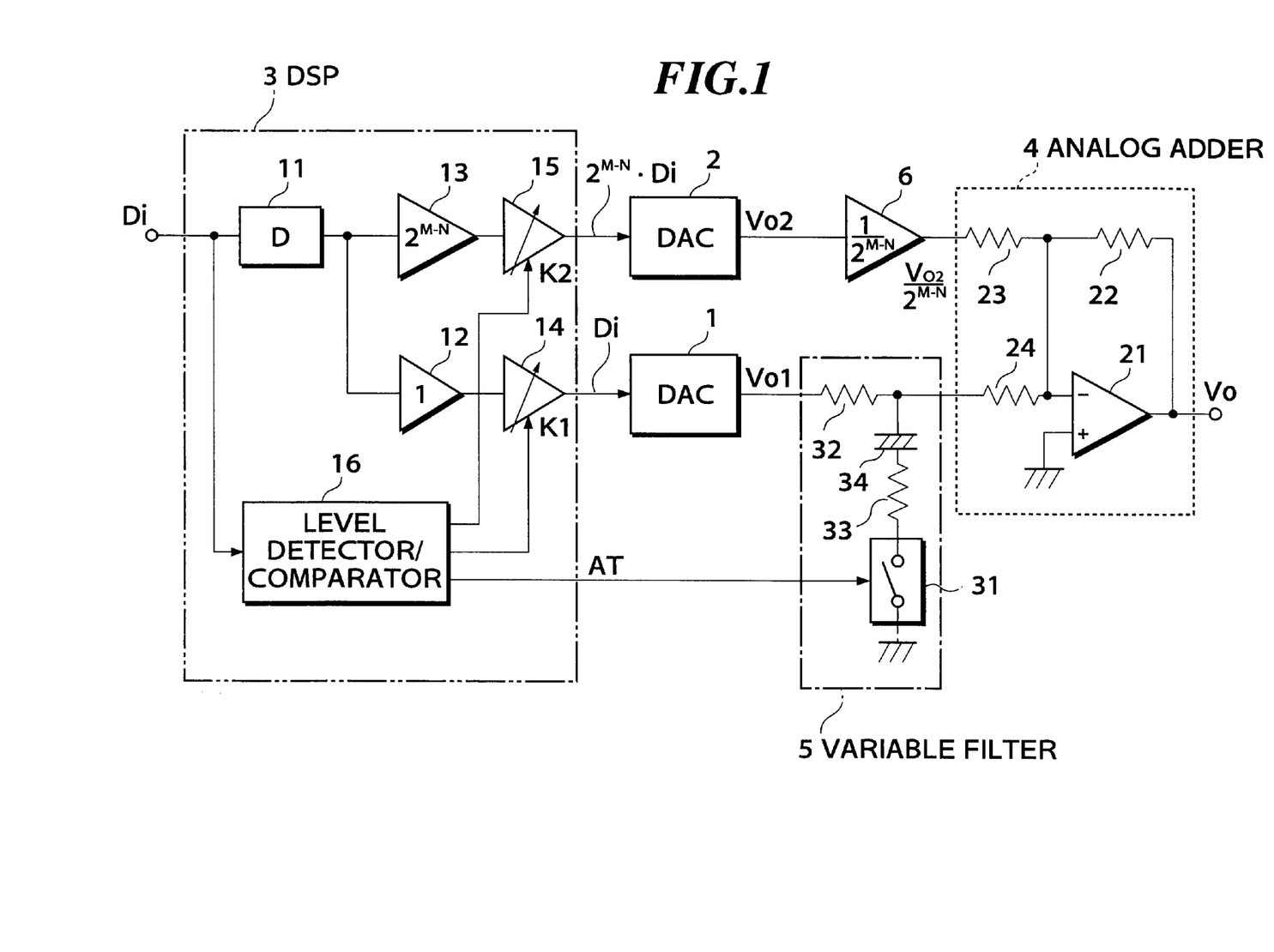
FIG. 1 is a circuit diagram of a D/A conversion apparatus according to one embodiment of the present invention.

FIG. 1 shows the configuration of a D/A conversion apparatus according to one embodiment of the invention.

The apparatus of the present embodiment has two D/A conversion systems, namely, a first system including a first D/A converter (hereinafter referred to as "DAC") 1 having conversion accuracy of N bits (for example, 24 bits), and a second DAC 2 having conversion accuracy of N bits. A digital signal processing circuit in the form of a digital signal processor (hereinafter referred to as "DSP") 3 is provided in a previous stage of the DACs 1, 2. The DSP 3 includes a delay circuit 11, a multiplier 12, a multiplier 13, cross-faders 14, 15 as digital attenuating devices, and a level detector/comparator 16. The delay circuit 11 receives input digital data Di of M significant bits (M>N: for example; 27 bits) as common input data for the two systems, and delays the digital data Di by a predetermined period of time point t1. The multiplier 12 supplies the output of the delay circuit 11 to the DAC 1 without converting it, namely, by multiplying the output by a factor of 1, while the multiplier 13 multiplies the output of the delay circuit 11 by a factor of $2^{M-N}$ (8 in this embodiment), and supplies the result to the DAC 2. The cross-faders 14, 15 serve to attenuate a selected one of the outputs of the multipliers 12, 13 to be lower than the noise level of the DACs 1, 2, and multiply the respective outputs by suitable coefficients K1, K2 (K1+K2=1), so as to cross-fade these outputs when the one of the outputs that has been selected to be attenuated is switched to the other output. The level detector/comparator 16 detects the level of the input digital data Di, and compares the detected level with a predetermined threshold value, so as to control switching of the cross-faders 14, 15, and others.

The level detector/comparator 16 shifts the digital data Di toward MSB (the most significant bit) only by M−N bits (3 bits in this embodiment). In the case where the most significant bit of the significant bits P overflows (i.e., P>N), the level detector/comparator 16 sets K1 to 1 and sets K2 to 0, so that the cross-fader 14 generates and delivers the digital data Di to the DAC 1 after truncating its less significant M−N bits, and the cross-fader 15 generates and delivers to the DAC 2 data of 0 obtained as a result of the digital attenuation. Where the most significant bit of the significant bits P does not overflow (i.e., P≦N) when the digital data Di is shifted toward the MSB by M−N bits, the level detector/comparator 16 sets K1 to 0 and K2 to 1, so that the cross-fader 14 generates and delivers data of 0 to the DAC 1, and the cross-fader 14 generates and delivers data of $2^{M-N} \times Di$ to the DAC 2.

The DAC 1 generates an analog signal Vo1 that provides one of two inputs for an analog adder 4. The DAC 2 generates an analog signal Vo2, which is multiplied by $\frac{1}{2}^{M-N}$ (⅛ in this embodiment) by an attenuator 6, and received as another input of the analog adder 4. The analog adder 4 takes the form of an inverting amplifier formed of an operational amplifier 21, a feedback resistance 22, and input resistances 23, 24, and functions to add the input analog signals Vo1 and Vo2/$2^{M-N}$ together. A variable filter 5 is connected between the DAC 1 and the analog adder 4. The variable filter 5 is formed of an analog switch 31 that is turned on in response to an attenuation command signal AT generated by the level detector/comparator 16 when the DAC1 is in the state of digital attenuation, and a low-pass filter circuit including resistances 32, 33 and a capacitor 34.

In the D/A conversion apparatus thus constructed, the output Vo of the analog adder 4 is given by:

$$Vo = Vo1 + Vo2/2^{M-N} \quad (1)$$

Where DAC1 (Di) and DAC2 (Di) represent intrinsic conversion outputs generated by the DACs 1, 2 when they receive the digital data Di, and VN1 and VN2 represent residual noise contained in the respective outputs Vo1, Vo2, the outputs Vo1, Vo2 of the DAC 1, 2 are respectively given by:

$$Vo1 = DAC1(Di) + VN1$$

$$Vo2 = 2^{M-N} \times DAC2(Di) + VN2 \quad (2)$$

Accordingly, the output Vo of the analog adder 4 is given by:

$$Vo = DAC1(Di) + DAC2(Di) + VN1 + VN2/2^{M-N} \quad (3)$$

Here, the DSP 3 selects one of the outputs DAC1(Di) and DAC2(Di) that has the higher rate of bits that are utilized without overflowing, namely, the one having the better signal quality, and therefore the output Vo is given by:

$$Vo = DAC(Di) + VN1 + VN2/2^{M-N} \quad (4)$$

As is apparent from the above expression (4), since the noise VN2 generated by the DAC 2 is reduced to $\frac{1}{2}^{M-N}$ while the noise VN1 generated by the DAC 1 is not reduced, the noise floor is determined by residual noise on the side of the DAC 1. Suppose 27-bit input digital data (M=27) is received and converted by DAC 1 or 2 having 24-bit conversion accuracy (N=24). While the DAC 1 is operating, data corresponding to only 24 bits is converted at a time, and thus the noise floor cannot be lowered below 144 dB. While the DAC 2 is operating, on the other hand, it is able to convert data corresponding to 27 bits at a time, and its dynamic range is supposed to be expanded until its lower limit reaches 162 dB. If the residual noise of the DAC 1 is added to the output signal, however, the noise floor cannot be lowered below 144 dB. In the apparatus of the present embodiment, therefore, the level detector/comparator 16 generates the attenuation command signal AT so as to turn on the variable filter 5 while the DAC 2 is being selected. In this manner, the noise floor can be reduced while the DAC 2 is being selected, and the dynamic range can be expanded down to 162 dB.

As the input impedance of the operational amplifier 21 changes depending upon whether the variable filter 5 is in the ON state or OFF state, the gain of the analog adder 4 changes, resulting in fluctuation in the output offset voltage of the operational amplifier 21. Generally, the degree of fluctuation, or variation, in the output offset voltage of the operational amplifier 21 is about 0.5 mV, while the noise level of the DAC is several $\mu$V (micron-volts) (1LSB≈0.6$\mu$ Vrms in the case of 24-bit DAC). Thus, the variation of about 0.5 mV in the output offset voltage is a considerably large value in view of the resolution of the DAC, and thus cannot be ignored. To solve this problem, the variable filter 5 of the present embodiment takes the form of a low-pass filter adapted to attenuate only medium-to-high frequency components, so that the input impedance of the analog adder 4 in terms of direct current does not vary upon turn-on or turn-off of the variable filter 5.

Figure 2:
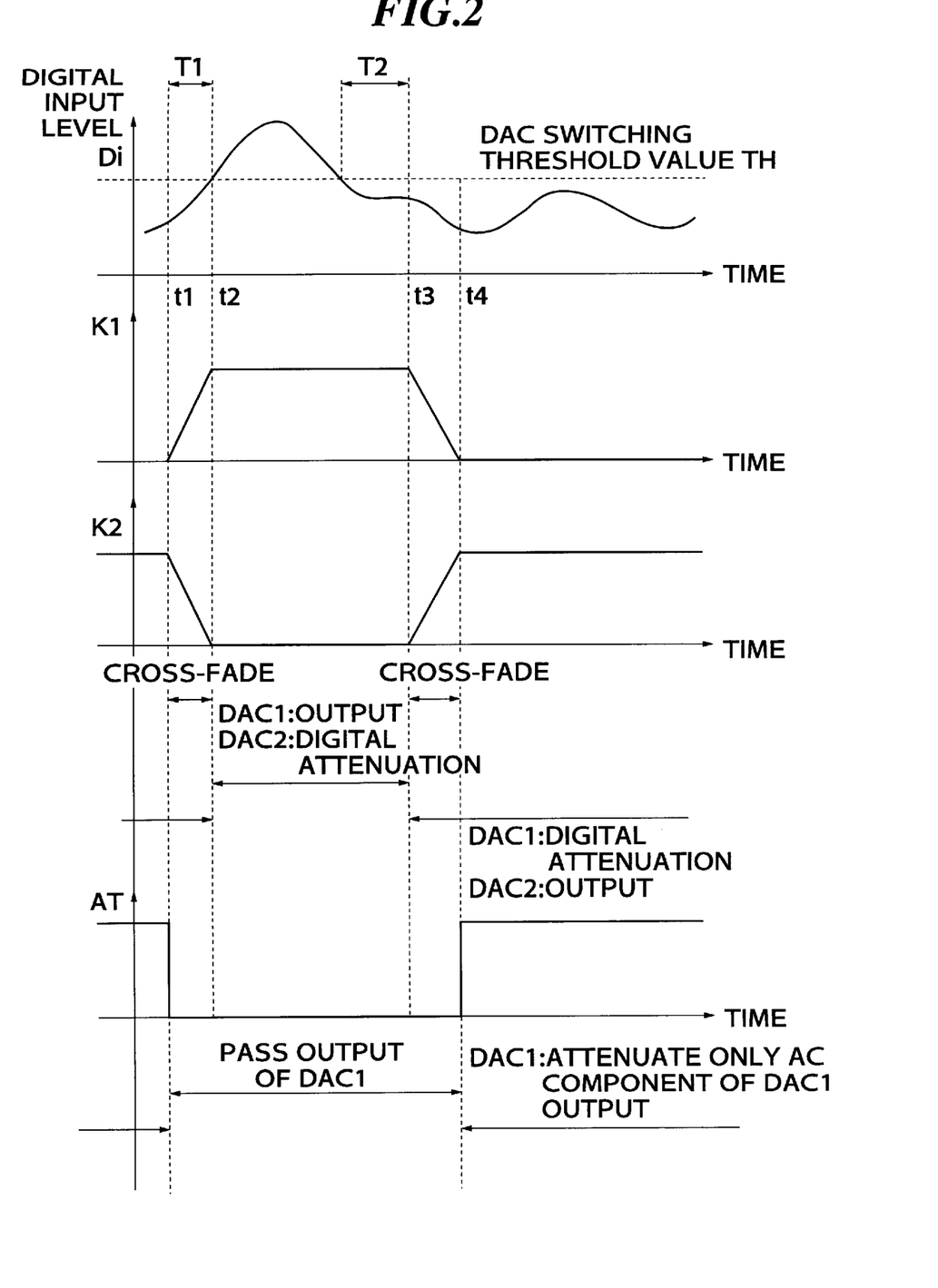
FIG. 2 is a timing chart useful in explaining the operation of the apparatus of FIG. 1.

FIG. 2 is a time chart showing the operation of the DSP 3 for switching between the DAC 1 and the DAC 2, and the on/off timing of the attenuation command signal AT.

The switching of the DACs 1, 2 takes place over a certain period of time (T1), through the cross-fade processing, so as to prevent transient distortion upon switching, poor signal tracking capability, and pop noise, for example. In FIG. 2, the input digital data Di overflows, namely, exceeds a predetermined threshold value TH at a time point t2, and falls below the threshold value at a time point t3. In this case, the ON/OFF states of the DAC 1 and DAC 2 are switched or changed so that the DAC 1 starts generating the effective output at the time point t2, and the DAC 2 starts generating the effective output at the time point t3. To switch the effective output from the DAC 2 to the DAC 1, cross fading is initiated a certain period of time point t1 (needed for cross-fading) ahead of the switching time point t2. To switch the effective output from the DAC 1 to the DAC 2, on the other hand, cross fading is initiated when the overflow disappears, namely, when the digital input level falls below the threshold value TH. To this end, the delay circuit 11 of the DSP3 delays the input digital data Di by a predetermined period of time T1, so that the level detector/comparator 16 can detect overflow of the input data Di the predetermined period of time T1 ahead of the switching from the DAC 2 to DAC1. With the switching operation thus controlled, clipping of data can be advantageously avoided when the level of the input digital data Di is increased.

The attenuation command signal AT starts being generated a certain period of time behind the time point (t3) when the DAC 1 is brought into the OFF state, and stops being generated a certain period of time ahead of the time point (t2) when the DAC 1 is brought into the ON state. With the on/off timing of the attenuation command signal AT thus controlled, transient noise can be avoided which would otherwise occur if the DAC 1 is generating the effective output when the attenuation command signal is brought into the ON or OFF state.

Figure 3:
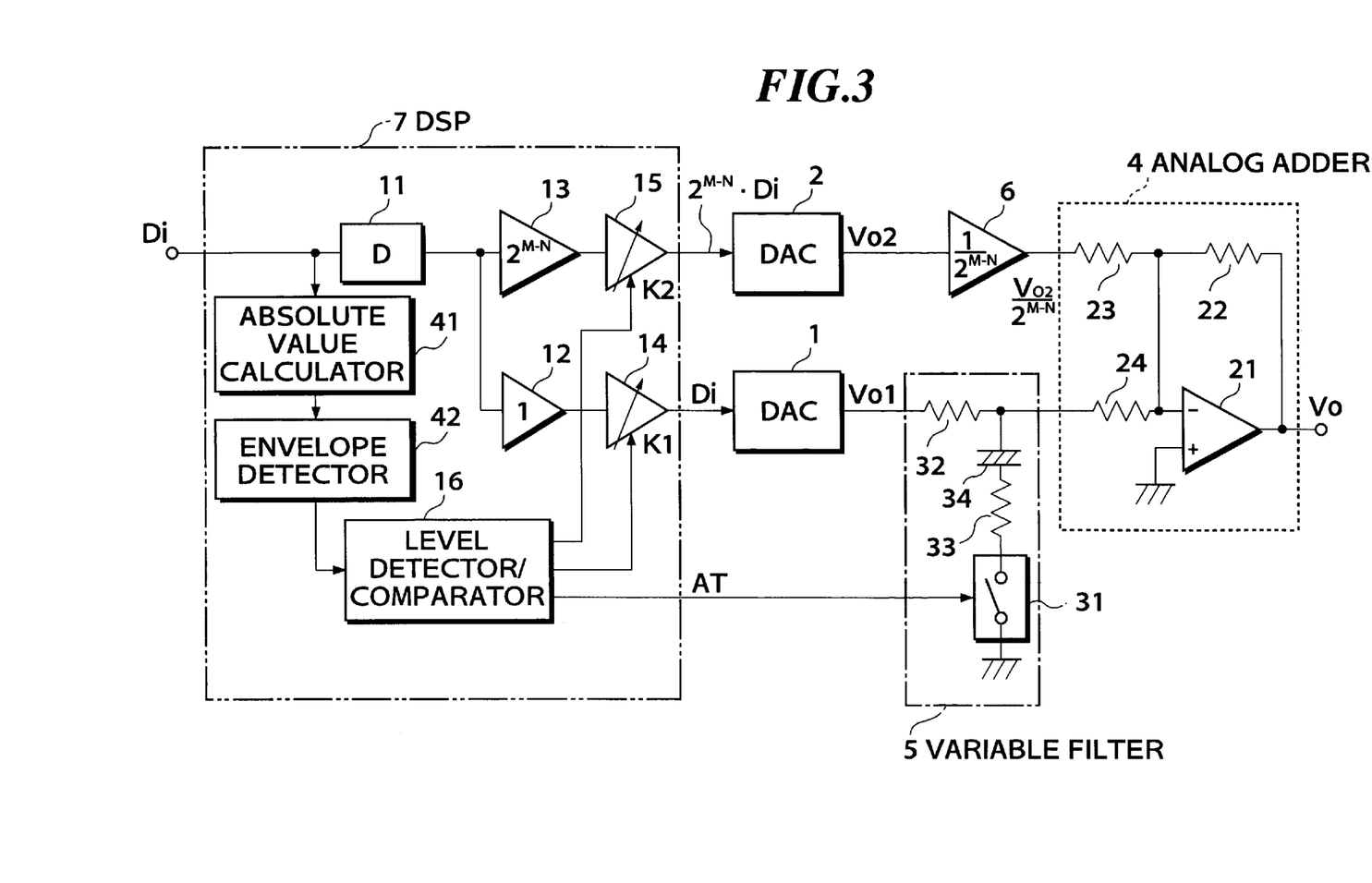
FIG. 3 is a circuit diagram of a D/A conversion apparatus according to another embodiment of the invention.

FIG. 3 shows the configuration of a D/A conversion apparatus according to another embodiment of the invention. In FIG. 3, the same reference numerals as used in FIG. 1 are used to designate corresponding components, of which detailed description is omitted.

In the circuit of FIG. 3, the DSP 7 includes an absolute value calculator 41 that obtains an absolute value of the input digital data Di, and an envelope detector 42 that detects an envelope from the output of the absolute value calculator 41. The output of the envelope detector 42 is supplied to the level detector/comparator 16.

Figure 4:
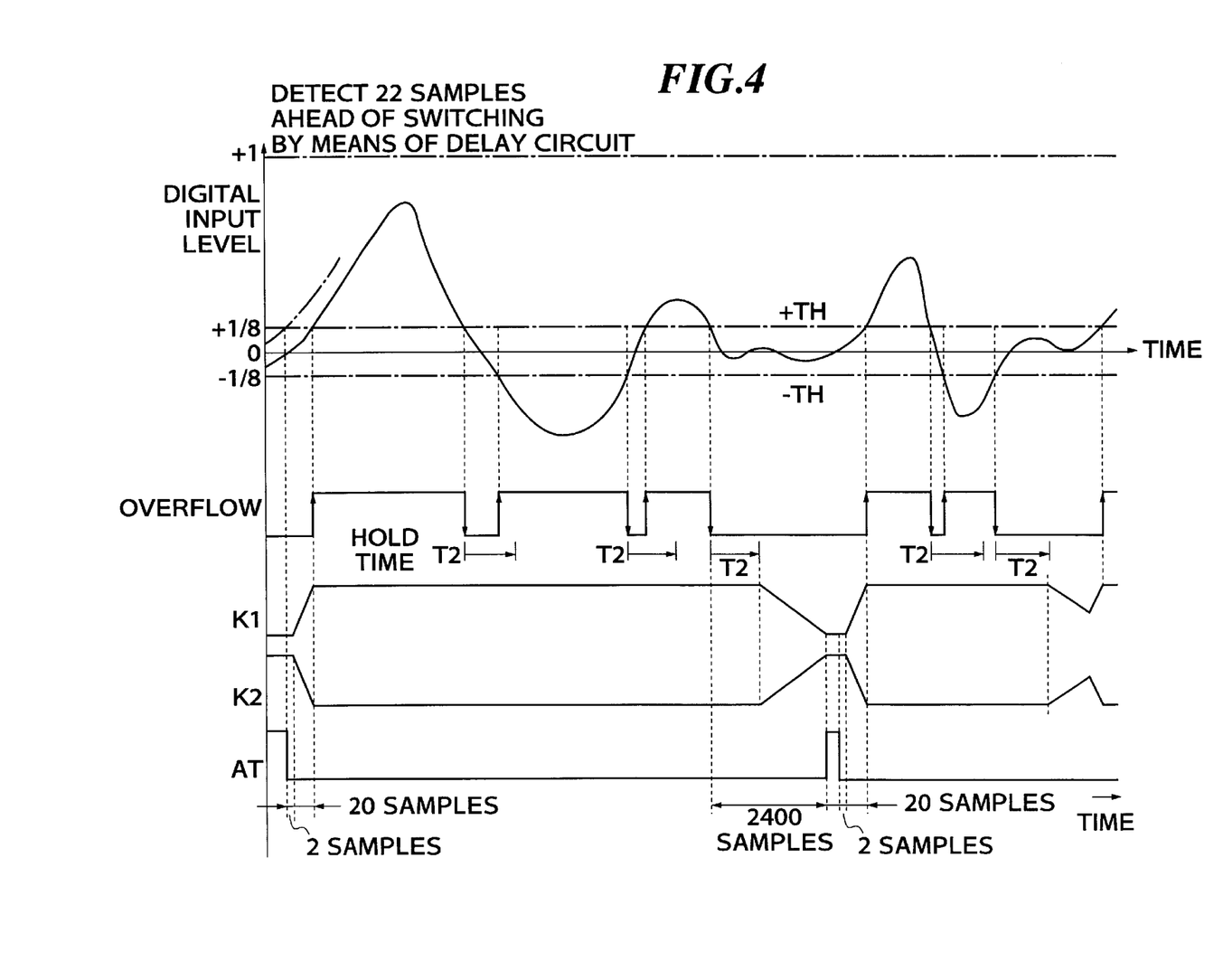
FIG. 4 is a timing chart useful in explaining the operation of the apparatus of FIG. 3.

FIG. 4 is a time chart showing the operation of this apparatus for switching DAC1 and DAC2, and the on/off timing of the attenuation command signal AT.

Where the input digital data Di contains high frequency components, as shown in FIG. 4, the digital input level frequently exceeds a threshold value +TH and falls below a threshold value −TH. To prevent frequent switching of the DACs 1, 2, the envelope detector 42 serves to detect the envelope of the input digital data.

In the present embodiment, when the amplitude of the input signal Di changes from a high level to a low level, namely, when the level detector/comparator 16 detects termination of the overflow of the digital data Di, the DSP 7 waits for a certain hold period of time T2, without immediately initiating the cross-fade processing for switching from the DAC 1 to DAC 2. The cross-fade processing is then initiated only in the case where no overflow of the digital data Di is detected again during the hold period of time T2. With the cross-fade processing thus controlled, the ON-OFF states of the DACs 1, 2 are prevented from being switched whenever an AC signal passes through a low level range in the process of change of the signal from a + (positive) level to a − (negative) level, or prevented from being frequently switched due to the signal waveform containing high-frequency components. Consequently, unnecessary noise can be further reduced.

The noise occurring upon switching of the DAC 1, 2 can also be effectively reduced by performing cross-fading for a longer period of time. For example, where the sampling frequency Fs is equal to 48 kHz, the cross-fade time is controlled to 50 ms so that 2400 samples are spent for cross-fade processing. As a result, noise occurrence due to frequent switching can be avoided. While the amplitude level of the input signal is increasing, on the other hand, it is desirable to instantly switch from the DAC 2 to the DAC 1 (i.e., cut off the effective output of the DAC 2 and pass that of the DAC 1), and therefore the time period of the cross-fade processing is controlled to about 20 samples, for example.

The cross faders 14, 15 linearly cross-fade the input data to the DAC 1 and the DAC 2, respectively, by multiplying the digital data by respective coefficients K1 or K2 that linearly change with time. This processing may be a little more simplified by employing a method in which the digital data is shifted by one bit at a time from the side of MSB (most significant bit). In this case, the coefficient K1, K2 changes non-linearly, more specifically, increases to be doubled at a time, and decreases to be halved at a time. Also, the cross-fade coefficients K1, K2 may be determined using a logarithmic curve. In this case, the switching processing matches the human auditory characteristic that changes logarithmically.

Regarding the advance detection of a level change in the input digital data Di for switching from the DAC2 to the DAC 1, the level detector/comparator 16 controls ON/OFF of the attenuation command signal AT, for example, two samples ahead of the switching, in view of a delay in the processing on the analog side including the analog attenuation circuit 5.

Figure 5:
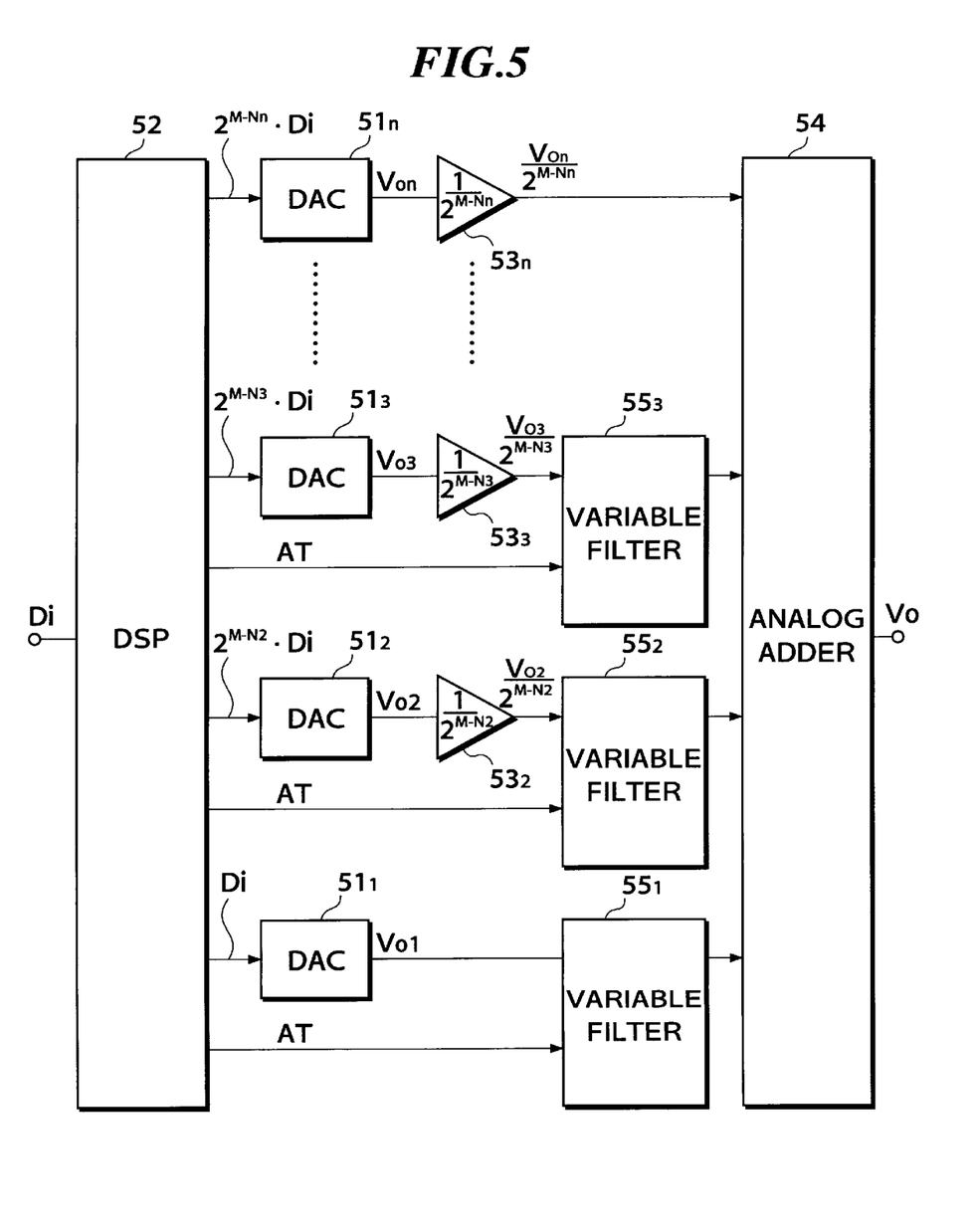
FIG. 5 is a block diagram of a D/A conversion apparatus according to a further embodiment of the present invention.

It is to be understood that the present invention is not limited to the illustrated embodiments. While only two systems of DAC are used in the above embodiments, the present invention may be applied to an apparatus including a plurality of DACs 511, 512, 513, . . . , 51$n$, as shown in FIG. 5. A DSP 52 multiplies the digital data Di by 1, $2^{M-N1}$, . . . , $2^{M-Nn}$ (where $1<2^{M-N1}<\ldots<2^{M-Nn}$), selects only one output of DACs 511–51$n$, and generates the selected output as it is, while digitally attenuating the other outputs of the DACs 511–51$n$. On the output side of the DACs 512–51$n$, there are provided attenuators 532, 533, . . . , 53$n$ for converting the levels of the analog signals again, and the outputs of the DACs 51₁ and attenuators 53₂–53n are added together by an analog adder 54, and the resulting sum is generated from the adder 54.

In this case, too, the cross-fade processing is performed when switching from the output of the DAC that has been selected, to the output of the DAC that is to be selected next, depending upon the level of the input digital data, and, while the DAC having the largest conversion factor is being selected, the outputs of the other DACs are attenuated by variable filters 55₁, 55₂, . . . , 55n−1. The D/A conversion apparatus thus constructed always ensures the maximum dynamic range, with reduced noise.

When a system having a smaller conversion factor than that of a DAC 51k is selected, it suffices in practical use if the analog output(s) of one or more DACs having a smaller conversion factor than that of the selected system is/are attenuated. More specifically, if the output of the DAC 51₂ is being selected, only the analog output of the DAC 51₁ may be attenuated. Namely, the conversion factor of the DAC 51₃ is larger than that of the DAC 51₁, and therefore the output of the DAC 51₃ undergoes an accordingly large attenuation due to level re-conversion in the analog signal stage. Consequently, the residual noise of the DAC 51₃ is smaller than that of the DAC 51₁, and thus has only a small influence on the resulting analog signal. It is to be understood, however, that all of the analog outputs other than that of the DAC 51₂ that is being selected, including those of the DAC 51₃–51n, may be attenuated.

It is also to be understood that the shift amount is not limited to (M−N) bits as used in the illustrated embodiments, but may be arbitrarily set to any value.

What is claimed is:

1. A D/A conversion apparatus, comprising:
   an input terminal that receives input digital data;
   a level converting device that converts the input digital data with different conversion factors, to generate a plurality of digital data having different levels;
   an output device that selects one of the plurality of digital data generated by said level converting device, depending upon a digital input level of the input digital data, to generate selected digital data, while attenuating the other digital data to be lower than a predetermined noise level, to generate attenuated digital data;
   a plurality of D/A converting devices that convert respective selected digital data generated by said output device, into corresponding analog signals;
   a re-converting device that converts a level of each of the analog signals generated by said D/A converting devices, into an original level, based on a corresponding one of the conversion factors with which the input digital data is converted by said level converting device to generate re-converted analog signals;
   an adding device that adds the re-converted analog signals generated by said re-converting device; and
   an attenuating device that attenuates, in an input stage of said adding device, medium-to-high frequency components of at least one of the analog signals generated by at least one of said D/A converting devices that receives the attenuated digital data, said at least one of the analog signals corresponding to digital data obtained by converting the input digital data with a smaller conversion factor than that of the selected digital data generated by said output device.

2. A D/A conversion apparatus according to claim 1, wherein said input terminal, said level converting device, and said output device constitute a DSP.

3. A D/A conversion apparatus according to claim 1, wherein said predetermined noise level is a noise level of a corresponding one of said D/A converting devices.

4. A D/A conversion apparatus according to claim 1, wherein said output device generates an attenuation command signal that instructs said attenuating device to attenuate said at least one of the analog signals, depending upon the digital input level of the input digital data, and
   wherein said attenuating device is responsive to said attenuation command signal, for attenuating the medium-to-high frequency components of said at least one the analog signals.

5. A D/A conversion apparatus according to claim 4, wherein said attenuating device comprises a low-pass filter that attenuates the medium-to-high-frequency components of said at least one of the analog signals.

6. A D/A conversion apparatus comprising:
   an input terminal that receives input digital data;
   a level converting device that converts the input digital data with different conversion factors, to generate a plurality of digital data having different levels;
   an output device that selects one of the plurality of digital data generated by said level converting device, depending upon a digital input level of the input digital data, to generate selected digital data, while attenuating the other digital data to be lower than a predetermined noise level, to generate attenuated digital data;
   a plurality of D/A converting devices that convert respective selected digital data generated by said output device, into corresponding analog signals;
   a re-converting device that converts a level of each of the analog signals generated by said D/A converting devices, into an original level, based on a corresponding one of the conversion factors with which the input digital data is converted by said level converting device to generate re-converted analog signals;
   an adding device that adds the re-converted analog signals generated by said re-converting device; and
   an attenuating device that attenuates, in an input stage of said adding device, medium-to-high frequency components of at least one of the analog signals generated by at least one of said D/A converting devices that receives the attenuated digital data, said at least one of the analog signals corresponding to digital data obtained by converting the input digital data with a smaller conversion factor than that of the selected digital data generated by said output device, wherein said output device generates an attenuation command signal that instructs said attenuating device to attenuate said at least one of the analog signals, depending upon the digital input level of the input digital data, and wherein said attenuating device is responsive to said attenuation command signal, for attenuating the medium-to-high frequency components of said at least one of the analog signals, and said attenuating device comprises a switching device, and a low-pass circuit including a resistance and a capacitor that are connected in series with said switching device, said switching device being turned on/off in response to the attenuation command signal generated by said output device, to lead to ground current of one of the re-converted analog signals from said re-converting device which corresponds to the attenuated digital data.

7. A D/A conversion apparatus, comprising:
   an input terminal that receives input digital data;
   a level converting device that converts the input digital data with different conversion factors, to generate a plurality of digital data having different levels;

an output device that selects one of the plurality of digital data generated by said level converting device, depending upon a digital input level of the input digital data, to generate selected digital data, while attenuating the other digital data to be lower than a predetermined noise level, to generate attenuated digital data;

a switching device that switches, upon selection of the digital data, between first digital data that has been selected and generated, and second digital data that is to be selected and generated next, while cross-fading the first and second digital data;

a plurality of D/A converting devices that convert respective selected digital data generated by said output device, into corresponding analog signals;

a re-converting device that converts a level of each of the analog signals generated by said D/A converting devices, into an original level, based on a corresponding one of the conversion factors with which said level conversion device converts the input digital data to generate re-converted analog signals; and an adding device that adds the re-converted analog signals generated by said re-converting device.

8. A D/A conversion apparatus according to claim 7, wherein said input terminal, said level converting device, said output device, and said switching device constitute a DSP.

9. A D/A conversion apparatus according to claim 7, wherein said predetermined noise level is a noise level of a corresponding one of said D/A converting devices.

10. A D/A conversion apparatus according to claim 7, further comprising an attenuating device that attenuates, in an input stage of said adding device, medium-to-high frequency components of at least one of the analog signals generated by at least one of said D/A converting devices that receives the attenuated digital data, said at least one of the analog signals corresponding to digital data obtained by converting the input digital data with a smaller conversion factor than that of the selected digital data generated by said output device.

11. A D/A conversion apparatus according to claim 10, wherein said output device generates an attenuation command signal that instructs said attenuating device to attenuate said at least one of the analog signals, depending upon the digital input level of the input digital data, and wherein said attenuating device is responsive to said attenuation command signal, for attenuating the medium-to-high frequency components of said at least one of the analog signals.

12. A D/A conversion apparatus according to claim 10, wherein said attenuating device comprises a low-pass filter that attenuates the medium-to-high frequency components of said at least one of the analog signals.

13. A D/A conversion apparatus comprising:

an input terminal that receives input digital data;

a level converting device that converts the input digital data with different conversion factors, to generate a plurality of digital data having different levels;

an output device that selects one of the plurality of digital data generated by said level converting device, depending upon a digital input level of the input digital data, to generate selected digital data, while attenuating the other digital data to be lower than a predetermined noise level, to generate attenuated digital data;

a switching device that switches, upon selection of the digital data, between first digital data that has been selected and generated, and second digital data that is to be selected and generated next, while cross-fading the first and second digital data;

a plurality of D/A converting devices that convert respective selected digital data generated by said output device, into corresponding analog signals;

a re-converting device that converts a level of each of the analog signals generated by said D/A converting devices, into an original level, based on a corresponding one of the conversion factors with which said level conversion device converts the input digital data to generate re-converted analog signals;

an adding device that adds the re-converted analog signals generated by said re-converting device; and an attenuating device that attenuates, in an input stage of said adding device, medium-to-high frequency components of at least one of the analog signals generated by at least one of said D/A converting devices that receives the attenuated digital data, said at least one of the analog signals corresponding to digital data obtained by converting the input digital data with a smaller conversion factor than that of the selected digital data generated by said output device, wherein said attenuating device comprises a switching device, and a low-pass circuit including a resistance and a capacitor that are connected in series with said switching device, said switching device being turned on/off in response to an attenuation command signal generated by said output device, to lead to ground current of one of the re-converted analog signals from said re-converting device which corresponds to the attenuated digital data.

14. A D/A conversion apparatus, comprising:

an input terminal that receives input digital data;

a level converting device that converts the input digital data with different conversion factors, to generate a plurality of digital data having different levels;

an output device that selects one of the plurality of digital data generated by said level converting device, depending upon a digital input level of the input digital data, to generate selected digital data, while attenuating the other digital data to be lower than a predetermined noise level, to generate attenuated digital data;

a switching device that switches, upon selection of the digital data, between first digital data that has been selected and generated, and second digital data that is to be selected and generated next, while cross-fading the first and second digital data;

a plurality of D/A converting devices that convert respective selected digital data generated by said output device, into corresponding analog signals;

a re-converting device that converts a level of each of the analog signals generated by said D/A converting devices, into an original level, based on a corresponding one of the conversion factors with which said level conversion device converts the input digital data to generate re-converted analog signals;

an adding device that adds the re-converted analog signals generated by said re-converting device; and a delay device that delays the input digital data by a predetermined period of time, and a detecting device that detects a change in amplitude of the input digital data from a lower level to a higher level relative to a predetermined level, ahead of switching to the selected digital data, to allow for a period of time required for cross-fading, so that said switching device finishes cross-fading for switching to the selected digital data when an amplitude of the input digital data exceeds the predetermined level.

15. A D/A conversion apparatus comprising:

an input terminal that receives input digital data;

a level converting device that converts the input digital data with different conversion factors, to generate a plurality of digital data having different levels;

an output device that selects one of the plurality of digital data generated by said level converting device, depending upon a digital input level of the input digital data, to generate selected digital data, while attenuating the other digital data to be lower than a predetermined noise level, to generate attenuated digital data, wherein said output device instantly switches to the selected digital data when an amplitude of the input digital data changes from a lower level to a higher level relative to a predetermined level, and switches to the selected digital data when the amplitude of the input digital data changes from a higher level to a lower level relative to the predetermined level, so long as no change from a lower level to a higher level relative to the predetermined level is detected within a predetermined period of time;

a switching device that switches, upon selection of the digital data, between first digital data that has been selected and generated, and second digital data that is to be selected and generated next, while cross-fading the first and second digital data;

a plurality of D/A converting devices that convert respective selected digital data generated by said output device, into corresponding analog signals;

a re-converting device that converts a level of each of the analog signals generated by said D/A converting devices, into an original level, based on a corresponding one of the conversion factors with which said level conversion device converts the input digital data to generate re-converted analog signals; and an adding device that adds the re-converted analog signals generated by said re-converting device.

16. A D/A conversion apparatus comprising:

an input terminal that receives input digital data;

a level converting device that converts the input digital data with different conversion factors, to generate a plurality of digital data having different levels;

an output device that selects one of the plurality of digital data generated by said level converting device, depending upon a digital input level of the input digital data, to generate selected digital data, while attenuating the other digital data to be lower than a predetermined noise level, to generate attenuated digital data;

a switching device that switches, upon selection of the digital data, between first digital data that has been selected and generated, and second digital data that is to be selected and generated next, while cross-fading the first and second digital data;

a plurality of D/A converting devices that convert respective selected digital data generated by said output device, into corresponding analog signals;

a re-converting device that converts a level of each of the analog signals generated by said D/A converting devices, into an original level, based on a corresponding one of the conversion factors with which said level conversion device converts the input digital data to generate re-converted analog signals;

an adding device that adds the re-converted analog signals generated by said re-converting device; and an attenuating device that attenuates, in an input stage of said adding device, medium-to-high frequency components of at least one of the analog signals generated by at least one of said D/A converting devices that receives the attenuated digital data, said at least one of the analog signals corresponding to digital data obtained by converting the input digital data with a smaller conversion factor than that of the selected digital data generated by said output device, wherein said attenuating device cancels an attenuating operation for said at least one of the analog signals a predetermined period of time ahead of start of cross-fading when an amplitude of the input digital data changes from a lower level to a higher level relative to a predetermined level, and starts attenuating said at least one of the analog signals upon a lapse of a predetermined period of time after completion of the cross-fading when the amplitude of the input digital data changes from a higher level to a lower level relative to the predetermined level.

17. A D/A conversion apparatus, comprising:

an input terminal that receives input digital data;

a level converting device that converts the input digital data with different conversion factors, to generate a plurality of digital data having different levels;

an output device that selects one of the plurality of digital data generated by said level converting device in a manner that the respective digital data generated by said level converting device can provide higher resolution and wider dynamic range, to generate selected digital data, while attenuating the other digital data to be lower than a predetermined noise level, to generated attenuated digital data;

a plurality of D/A converting devices that convert respective selected digital data generated by said output device, into corresponding analog signals;

a re-converting device that converts a level of each of the analog signals generated by said D/A converting devices, into an original level, based on a corresponding one of the conversion factors to which the input digital data is converted by said level converting device to generate re-converted analog signals;

an adding device that adds the re-converted analog signals generated by said re-converting device; and an attenuating device that attenuates, in an input stage of said adding device, medium-to-high frequency components of at least one of the analog signals generated by at least one of said D/A converting devices that receives the attenuated digital data, said at least one of the analog signals corresponding to digital data obtained by converting the input digital data with a smaller conversion factor than that of the selected digital data generated by said output device.

18. A D/A conversion apparatus, comprising:

an input terminal that receives input digital data;

a level converting device that converts the input digital data with different conversion factors, to generate a plurality of digital data having different levels;

an output device that selects one of the plurality of digital data generated by said level converting device in a manner that the respective digital data generated by said level converting device can provide higher resolution and wider dynamic range, to generate selected digital data, while attenuating the other digital data to be lower than a predetermined noise level, to generate attenuated digital data;

a switching device that switches, upon selection of the digital data, between first digital data that has been selected and generated, and second digital data that is to be selected and generated next, while cross-fading the first and second digital data;

a plurality of D/A converting devices that convert respective selected digital data generated by said output device, into corresponding analog signals;

a re-converting device that converts a level of each of the analog signals generated by said D/A converting devices, into an original level, based on a corresponding one of the conversion factors with which said level conversion device converts the input digital data to generate re-converted analog signals; and an adding device that adds the re-converted analog signals generated by said re-converting device.

* * * * *